United States Patent [19]

Suzuki

[11] Patent Number: 4,798,450

[45] Date of Patent: Jan. 17, 1989

[54] IMAGING OPTICAL SYSTEM

[75] Inventor: Akiyoshi Suzuki, Tokyo, Japan

[73] Assignee: Canon Kabushiki Kaisha, Tokyo, Japan

[21] Appl. No.: 144,645

[22] Filed: Jan. 11, 1988

Related U.S. Application Data

[63] Continuation of Ser. No. 742,789, Jun. 10, 1985, abandoned.

[30] Foreign Application Priority Data

Jun. 14, 1984 [JP]   Japan ................................ 59-122302

[51] Int. Cl.$^4$ .............................................. G02B 17/06
[52] U.S. Cl. ................................... 350/505; 350/511; 350/620; 350/622
[58] Field of Search ............... 350/504, 505, 415, 442, 350/511, 561, 572, 573, 571, 620, 622

[56] References Cited

U.S. PATENT DOCUMENTS 3,748,015  7/1973  Offner ................................ 350/505
3,821,763  6/1974  Scott .
4,097,125  6/1978  Suzuki ................................ 350/620
4,293,186  10/1981 Offner ................................ 350/505

OTHER PUBLICATIONS

Kingslake, *Lens Design Fundamentals*, Academic Press, New York, 1978, pp. 229–230.
Southall, J. P. C., "Mirrors, Prisms and Lenses", MacMillan Co., 1923, pp. 420–423.
Strong, J. "Concepts of Classical Optics", W. H. Freeman & Co. 1958, pp. 348–349.
Born & Wolf, "Principles of Optics", Pergamon Press, Fifth Edition, 1975, pp. 186–188.

*Primary Examiner*—John K. Corbin
*Assistant Examiner*—Martin Lerner
*Attorney, Agent, or Firm*—Fitzpatrick, Cella, Harper & Scinto

[57] ABSTRACT

An imaging optical system including a first off-axis optical system for receiving light from an object disposed at a predetermined height from its optical axis and emitting the light; and a second off-axis optical system for receiving the light from said first optical system to form an image of the object at a predetermined height form its optical axis.

9 Claims, 3 Drawing Sheets

IMAGING OPTICAL SYSTEM

This application is a continuation of application Ser. No. 742,789 filed 6/10/85, now abandoned.

BACKGROUND OF THE INVENTION

The present invention relates to an imaging optical system which is usable, for example, for projecting an image of an object onto another object, as in semiconductor manufacturing apparatus.

U.S. Pat. Nos. 3,748,015, 3,821,763 and 4,097,125 disclose a so-called off-axis imaging optical system, in which the aberration is corrected at a point or a zone which is away from the optical axis thereof rather than on the optical axis thereof. U.S. Pat. No. 4,293,186 discloses an imaging optical system wherein two off-axis imaging optical systems are coaxially arranged. Further, USSR Patent No. 126,911 discloses an imaging optical system wherein an on-axis imaging optical system is eccentrically arranged with respect to an off-axis imaging optical system.

SUMMARY OF THE INVENTION

It is a principle object of the present invention to provide an imaging optical system wherein an image can be formed with minimum influence of an astigmatism.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

The preferred embodiments of the present invention will now be described in detail in conjunction with the accompanying drawings.

Figure 1:
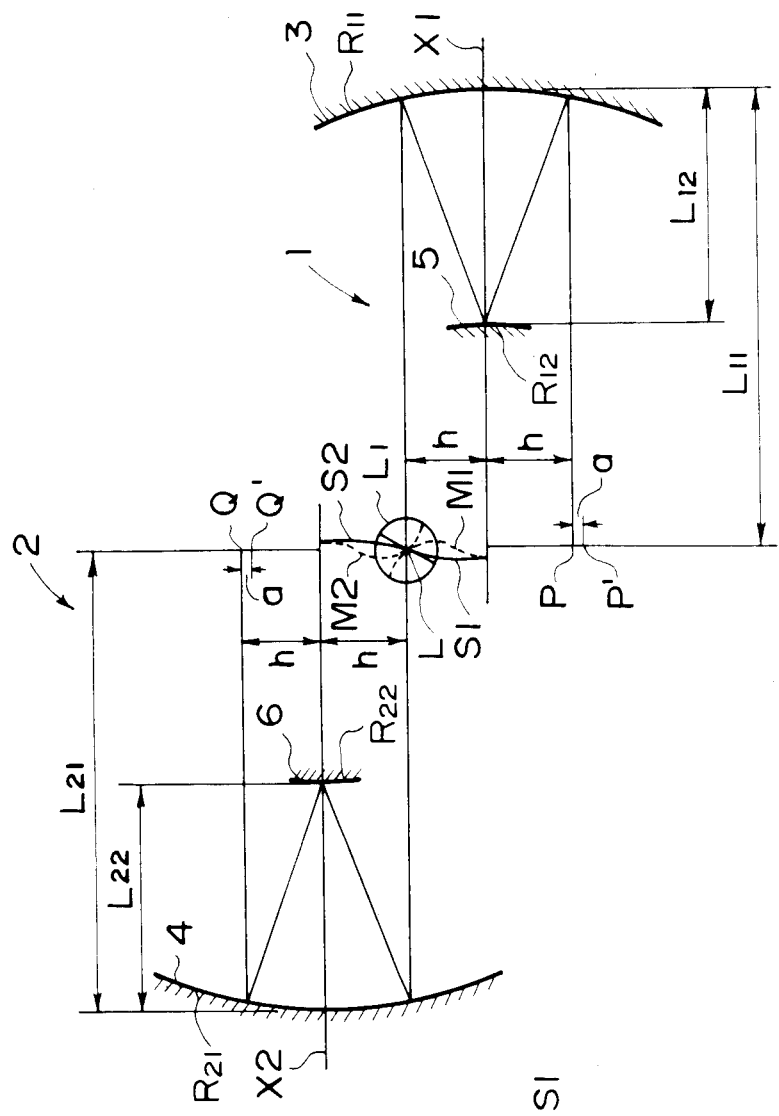
FIG. 1 shows an general arrangement of the optical system according to the embodiment of the present invention.

Referring to FIG. 1 there is shown the arrangement of an imaging optical system according to an embodiment of the present invention, wherein a first off-axis telecentric imaging optical system 1 comprises a concave mirror 3 and a convex mirror 5, and a second off-axis telecentric imaging optical system 2 comprises a concave mirror 4 and a convex mirror 6. The concave mirror 3 is coaxial with the convex mirror 5, and similarly the concave mirror 4 is coaxial with the convex mirror 6. In this embodiment, the corresponding elements are of the same structure and dimension.

The first and second optical systems respectively have the structures which are substantially the same as is disclosed in U.S. Pat. No. 4,097,125. Therefore, detailed description thereof will be omitted for the sake of simplicity by incorporating the disclosure of that parent herein by reference. The optical axes X1 and X2 of the two optical systems are parallel and spaced by a distance or height 2h ("h" will be described in more detail hereinafter).

An object point P, in an object plane of the first optical system 1, which plane is perpendicular to the optical axis X1 thereof and located at a height h from the optical axis X1, is imaged at unit magnification in an image plane, of the first optical system 1, perpendicular to the optical axis X1 on the opposite side of the optical axis X1 at a location of height h as a point L. The optical system of this embodiment is such that the image plane of the first optical system 1 where the point image L is formed is the object plane of the second optical system 2. Therefore, the point image L formed on the image plane of the first optical system 1 is formed or re-imaged in an image plane of the second optical system 2 as a point image Q on the opposite side of the optical axis X2 of the second optical system 2. Thus, the second optical system is effective to re-image the image formed by the first optical system 1.

Reference character P' indicates a position of the object that is spaced from the object point P of the first optical system 1 by a distance and Q' indicates a position of the image that is spaced from the image point Q of the second optical, system by a distance a. The distances of points P' and Q' from the optical axes X1 and X2 of the associated optical systems are $h+a$ and $h-a$ respectively. In the combined optical system of FIG. 1, the astigmatism is removed within the range of the distance a from the image point Q of the second optical system 2 as will be described below.

It has been found that the combined optical system having the arrangement described above provides an image of good quality. This result will be described in detail.

As described and as understood from FIG. 1, a principal ray of light from the object point P and parallel to the optical axis X1 is reflected by the concave mirror 3 and is incident on the convex mirror 5 surface at the cross point with the optical axis X1. Then, it is reflected symmetrically with the incident light and then reflected by the concave mirror 3. Thereafter, it travels parallel to the optical axis X1 toward the image plane. Therefore, as understood by those skilled in the art, the first optical system 1 is telecentric on the light emitting side.

Assuming that the point Q is an object point, a principal ray of light from the object point Q and parallel to the optical axis X2 is similarly reflected by the concave mirror 4 and is incident on the surface of the convex mirror 6 at the cross point with the optical axis X2. The principal ray is reflected symmetrically to the surface of the convex mirror 4 which reflects the light parallel to the optical axis X2, and the light travels to the image plane. Therefore, as also understood by those skilled in the art, the second optical system 2 is telecentric on the light receiving side. Each of the off-axis optical systems involves an astigmatism as shown in FIG. 1. The meridional image surface M1 of the first optical system and the sagital image surface S1 thereof cross each other at an image height h. Similarly, the meridional image surface M2 of the second optical system and the sagital image surface S2 thereof cross each other at the image height h. The inclinations of the meridional surfaces M1 and M2 are opposite but symmetrical, and similarly the sagital image surfaces S1 and S2 are opposite and symmetrical. Therefore, the astigmatism of the first optical system 1 is exactly opposite to the astigmatism of the first optical system 1. Therefore, the astigmatism of the first optical system can be substantially compensated for by the second optical system in the arrangement described above.

Figure 2:
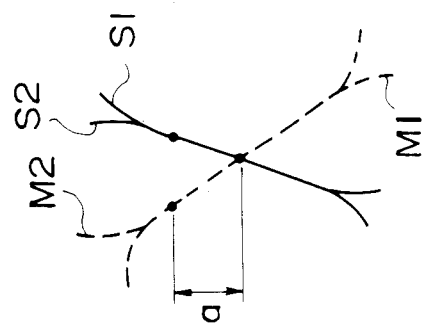
FIG. 2 illustrates in an enlarged scale the astigmatism in the optical system shown in FIG. 1.

FIG. 2 shows in an enlarged scale the meridional image surfaces M1 and M2 and the sagital image surfaces S1 and S2 at the image plane of the first optical system 1. As shown, the meridional image surface M1 of the first optical system is coincident with the meridional image surface M2 of the second optical system within the range a from the center thereof being at the correct image height h, that is, the cross point between the meridional image surface and the sagital image surface. Similarly, the sagital image surface S1 of the first optical system and the sagital image surface S2 of the second optical system are coincident with each other over substantially the same range. Such an arrangement is possible because the meridional image surfaces (sagital image surfaces) are symmetrical and reversed as described hereinbefore. Since each of the optical systems 1 and 2 is a unit magnification imaging system, a given object point in the object plane of the first optical system within the range of a from the image height h is imaged in the image plane of the second optical system at the corresponding point, and there is no astigmatism.

Figure 3:
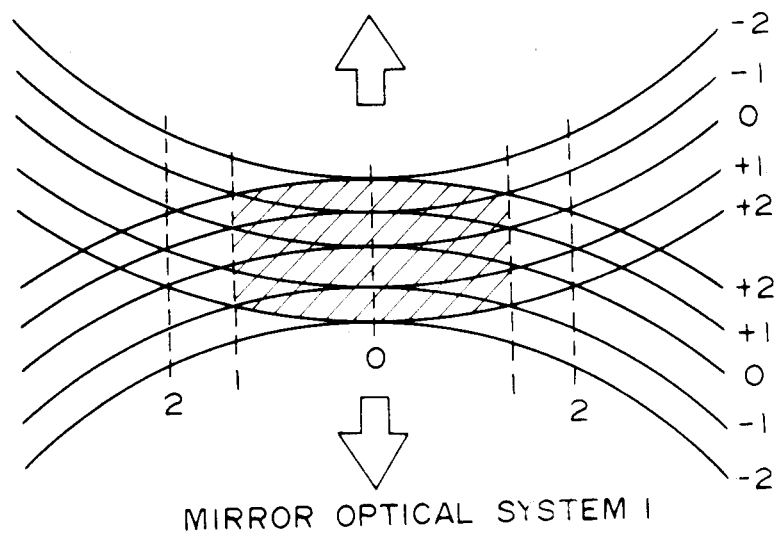
FIG. 3 shows a distribution of astigmatic differences according to the embodiment of the present invention.

FIG. 3 shows a distribution of astigmatic differences in the image plane of the first optical system. If the imaging optical system were an on-axis imaging system, the distribution would be in the form of concentric circles about the optical axis. However, the imaging optical systems of the present invention are off-axis type so that the distribution is different. More particularly, the points of the same astigmatic difference constitute a circle with its center coincident with the optical axis. The concave-up circles with the grades "+1", "+2" each indicate the same astigmatic difference line of the sagital image surface and the meridional image surface of the second optical system. The grades are the amounts of the astigmatic differences from a predetermined reference. Similarly, the concave down circles each indicate the same astigmatic difference line of the sagital image surace and the meridional image surface of the first optical system. The centers of the concentric concave-up circles and the concentric concave-down circles are coincident with the optical axes of the second optical system 2 and the first optical system 1, respectively.

Each of the circles indicated with the astigmatic difference "0" corresponds to the cross point between the sagital image surface and the meridional image surface, that is, the image height h.

The combined astigmatic difference is shown by the dotted lines. Since the combined astigmatic difference is the sum of the astigmatic differences of the first optical system and the second optical system, the straight lines each indicates the same total astigmatic difference distribution. That is, on the dotted lines "0", "1" and "2", the combined astigmatic differences are approximately "0", "1" and "2". As will be understood, the astigmatic difference of the first mirror optical system 1 offsets the astigmatic difference of the second mirror optical system 2, so that a good image can be obtained in the region hatched in FIG. 3.

In FIG. 3, the curves "+2", "+1", "0", "−1", "−2" are spaced at regular intervals. This indicates that the sagital image surface and meridional image surface change rectilinearly with respect to the change of the image height. In this case, the total astigmatic difference is constant along the dotted line, which is straight and parallel to a phantom line connecting the optical axes of the optical systems.

The optical system of this type involves an eclipse caused by the existence of the convex mirror 5 or 6, the eclipse extending from the optical axis to a certain degree away therefrom. It is assumed for the sake of simplicity of explanation, that the eclipse does not occur at the image height of "−2" and higher, that is, the range not lower than the image height "−2" is usable without the eclipse.

For example, if the allowable amount of the astigmatic difference is 1, the barrel region defined by the two dotted lines indicating the astigmatic difference "1" and the two curves indicating the astigmatic difference of "+2" is the useful region in this optical system according to this embodiment. The region outside the dotted lines 1 means the astigmatic difference larger than the allowable value, and the outside of the curves "+2" means the image height in the other optical system is less than "−2" so that the eclipse is involved.

If the sagital image surface and the meridional image surface do not change rectilinearly with respect to the image height, the curves "+2", "+1", "0", "−1", "−2" are at irregular intervals so that the dotted lines "0", "1", "2" is not straight but curved. However, in such a case, the fundamental idea of the present invention is applicable by selecting a proper allowable range.

The following is a table of the radii of curvature of mirrors and the distances between the optical elements of an example of the combined optical system in FIG. 1.

| | |
|---|---|
| $R_{11} = 600$ | $L_{11} = 604.075$ |
| $R_{12} = 300$ | $L_{12} = 295.745$ |
| $R_{21} = 600$ | $L_{21} = 604.075$ |
| $R_{22} = 300$ | $L_{22} = 295.745$ |
| $h = 100.16$ | |
| Effective diameter of the convex mirrors: | 95 |
| Effective diameter of the concave mirrors: | 400 |

In this example, $R_{11}$ is the radius of curvature of the concave mirror 3 of the first optical system 1;

$R_{12}$ is the radius of curvature of the convex mirror 5 of the first optical system 1;

$R_{21}$ is the radius of curvature of the concave mirror 4 of the second optical system;

$R_{22}$ is the radius of curvature of the convex mirror 6 of the second optical system;

$L_{11}$ is the distance measured on the axis between the object plane of the first optical system 1 and the concave mirror 3;

$L_{12}$ is the distance measured on the axis between the concave mirror 3 and the convex mirror 5;

$L_{21}$ is the distance measured on the axis between the imaging plane of the second optical system 2 and the concave mirror 4;

$L_{22}$ is the distance measured on the axis between the concave mirror 4 and the convex mirror 6; and h is the corrected image height described hereinbefore.

Figure 4:
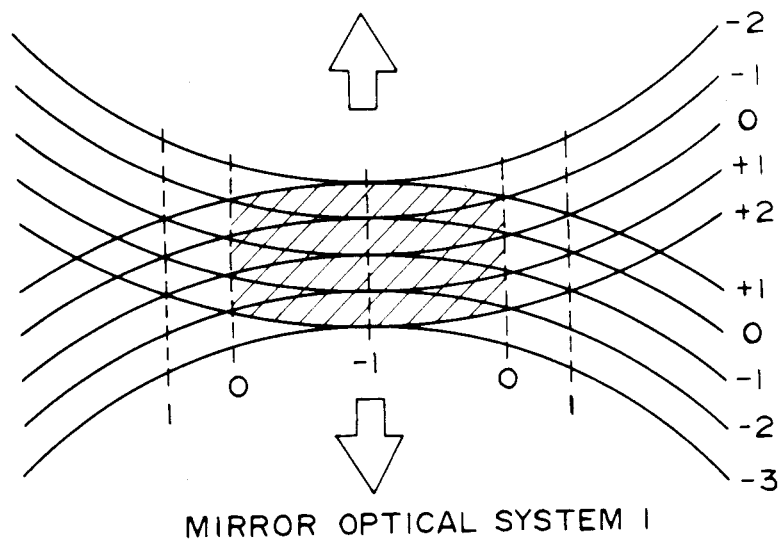
FIG. 4 shows a distribution of astigmatic differences according to another embodiment of the present invention.

In the exemplary arrangement described above, the optical axes X1 and X2 of the two optical systems 1 and 2 are disposed such that the no-astigmatic-difference curves, that is, the curves indicated with "0" are contact. However, this is not limiting. They may be spaced apart when the height of the eclipse zone is higher, or they may be overlaid as shown in FIG. 4 if the height of the eclipse zone is lower. In FIG. 4, the eclipse takes place at the height indicated by "−3" and lower than that in the first optical system 1.

The foregoing description has been made with respect to a reflection type optical system, but the present invention is applicable to a refraction type optical system.

Figure 5:
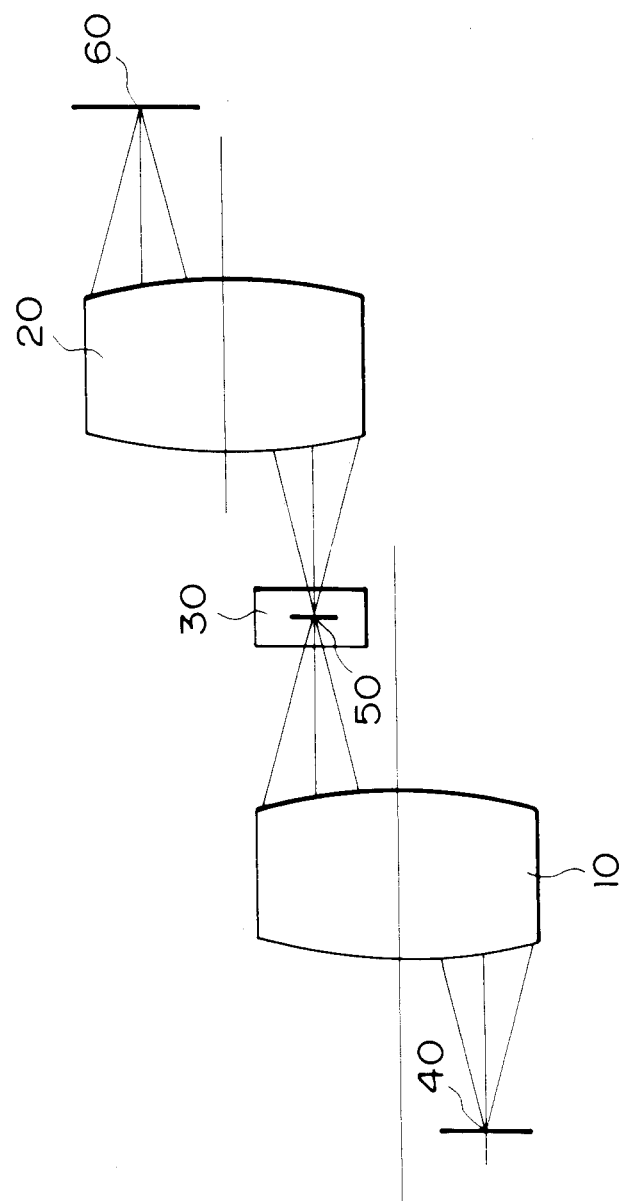
FIG. 5 shows the general arrangement of an imaging optical system according to a further embodiment of the present invention.

FIG. 5 shows an optical arrangement of the refraction type according to another embodiment of the present invention. The optical system includes an off-axis imaging optical system 10 which is effective to form a point image 50 of an object point 40 which is away from the optical axis, and an off-axis refraction type imaging optical system 20 for re-imaging the point image 50 as a point image 60. If the optical systems 10 and 20 are not telecentric optical systems, a lens 30 is provided as shown so that the exit pupil of the first optical system 10 and the entrance pupil of the second optical system 20 are conjugate with each other. The compensation for astigmatism as described with respect to the FIG. 1 embodiment applies to this refraction type optical system with the same principle, as will be understood by one skilled in the art.

In the foregoing description, a real image is once formed, which is then re-imaged as a real image. However, the present invention is not limited to such a case, but is applicable to the case where a false image is formed by a first optical system and the second optical system is arranged with respect to the false image.

While the invention has been described with reference to the structures disclosed herein, it is not confined to the details set forth and this application is intended to cover such modifications or changes as may come within the purposes of the improvements or the scope of the following claims.

What is claimed is:

1. An imaging optical system, comprising:
   a first off-axis optical system, having a first optical axis, for receiving light from an object disposed at a predetermined height from the first optical axis, and for emitting the light, said first off-axis optical system producing astigmatism; and
   a second off-axis optical system, having a second optical axis, disposed for receiving the light emitted from said first optical system to form an image of the object at a predetermined height from the second optical axis, the first optical axis of said first optical system being spaced from the second optical axis of said second optical system, said second optical system producing astigmatism that minimizes the astigmatism produced by said first off-axis optical system,
   whereby the image formed by said second optical system is substantially completely free of astigmatism within the predetermined height from the second optical axis of the second off-axis optical system.

2. An optical system according to claim 1, wherein said first optical system is a telecentric optical system in the light emitting side, and said second optical system is a telecentric optical system in the light receiving side.

3. An optical system according to claim 1, wherein an exit pupil of said first optical system and an entrance pupil of said second optical system are optically conjugate.

4. A system according to claim 1, wherein said first off-axis optical system and said second off-axis optical system each comprises a convex mirror and a concave mirror, and said first off-axis optical system and said second off-axis optical system are in a fixed positional relation with respect to each other.

5. An imaging optical system, comprising:
   a first off-axis optical system, having a first optical axis, for forming on a first imaging plane an image of an object located at a predetermined height from the first optical axis of said first off-axis optical system; and
   a second off-axis optical system, having a second optical axis, for forming on a second imaging plane an image of the image of the object formed by said first off-axis optical system on the first imaging plane, the second optical axis of said second off-axis optical system being offset from the first optical axis of said first off-axis optical system, whereby the image formed on the second imaging plane is substantially completely free of astigmatism within a predetermined height from the second optical axis of the second off-axis optical system.

6. A system according to claim 4, wherein said first off-axis optical system and said second off-axis optical system each comprise a convex mirror and a concave mirror, and said first off-axis optical system and said second off-axis optical system are in a fixed positional relation with respect to each other.

7. A system according to claim 6, wherein said first optical system is a telecentric optical system in the light emitting side, and said second optical system is a telecentric optical system in the light receiving side.

8. A system according to claim 4, wherein said first off-axis optical system and said second off-axis optical system have the same structure.

9. A system according to claim 4, wherein said first optical axis and said second optical axis are substantially parallel and are spaced by a fixed distance.

* * * * *

UNITED STATES PATENT AND TRADEMARK OFFICE
CERTIFICATE OF CORRECTION

PATENT NO. : 4,798,450
DATED : January 17, 1989
INVENTOR(S) : AKIYOSHI SUZUKI

It is certified that error appears in the above-identified patent and that said Letters Patent is hereby corrected as shown below:

Title page:

IN [57] ABSTRACT

Line 7, "form" should read --from--.

COLUMN 1

Line 25, "principle" should read --principal--.
Line 29, "These" should read --This--.
Line 36, "an" should read --the--.
Line 37, "the" (first occurrence) should read --an--.
Line 67, "the" (first occurrence) should be deleted.

COLUMN 2

Line 2, "parent" should read --patent--.
Line 26, "distance and" should read --distance a and--.
Line 28, "optical," should read --optical--.
Line 62, "sagital" should read --sagittal--.
Line 64, "sagital" should read --sagittal--.
Line 68, "sagital" should read --sagittal--.

UNITED STATES PATENT AND TRADEMARK OFFICE
CERTIFICATE OF CORRECTION

PATENT NO. : 4,798,450
DATED : January 17, 1989
INVENTOR(S) : AKIYOSHI SUZUKI

It is certified that error appears in the above-identified patent and that said Letters Patent is hereby corrected as shown below:

COLUMN 3

Line 3, "first optical system 1." should read --second optical system 2.--.
    Line 8, "sagital" should read --sagittal--.
    Line 15, "sagital" should read --sagittal--.
    Line 16, "sagital" should read --sagittal--.
    Line 17, "sagital" should read --sagittal--.
    Line 20, "(sagital" should read --(sagittal--.
    Line 39, "sagital" should read --sagittal--.
    Line 42, "concave down" should read --concave-down--.
    Line 44, "sagital" should read --sagittal-- and "surace" should read --surface--.
    Line 58, "indicates" should read --indicate--.
    Line 68, "sagital" should read --sagittal--.

COLUMN 4

Line 24, "sagital" should read --sagittal--.
    Line 28, "is" should read --are--.

COLUMN 5

Line 1, "contact." should read --in contact.--.

UNITED STATES PATENT AND TRADEMARK OFFICE
CERTIFICATE OF CORRECTION

PATENT NO. : 4,798,450
DATED : January 17, 1989
INVENTOR(S) : AKIYOSHI SUZUKI

Page 3 of 3

It is certified that error appears in the above-identified patent and that said Letters Patent is hereby corrected as shown below:

<u>COLUMN 6</u>

```
Line 18, "comprises" should read --comprise--.
Line 39, "claim 4," should read --claim 5,--.
Line 49, "claim 4," should read --claim 5,--.
Line 52, "claim 4," should read --claim 5,--.
```

Signed and Sealed this

Seventeenth Day of April, 1990

Attest:

HARRY F. MANBECK, JR.

*Attesting Officer*    *Commissioner of Patents and Trademarks*